US012655514B2

(12) United States Patent
Ikeda

(10) Patent No.: US 12,655,514 B2
(45) Date of Patent: Jun. 16, 2026

(54) FILM FORMATION APPARATUS AND FILM FORMATION METHOD OF GALLIUM NITRIDE FILM

(71) Applicant: Japan Display Inc., Tokyo (JP)

(72) Inventor: Masanobu Ikeda, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/939,732

(22) Filed: Nov. 7, 2024

(65) Prior Publication Data

US 2025/0066901 A1 Feb. 27, 2025

Related U.S. Application Data

(63) Continuation of application No. PCT/JP2023/014830, filed on Apr. 12, 2023.

(30) Foreign Application Priority Data

May 10, 2022 (JP) ................................. 2022-077637

(51) Int. Cl.
*C23C 14/34* (2006.01)
*C23C 14/06* (2006.01)
*C23C 14/54* (2006.01)
*H10P 14/20* (2026.01)
*H10P 14/22* (2026.01)

(52) U.S. Cl.
CPC ...... *C23C 14/3407* (2013.01); *C23C 14/0617* (2013.01); *C23C 14/541* (2013.01); *H10P 14/22* (2026.01); *H10P 14/3416* (2026.01)

(58) Field of Classification Search
CPC .................................................. C23C 14/082
See application file for complete search history.

(56) References Cited

U.S. PATENT DOCUMENTS

| 2001/0017257 A1* | 8/2001 | Choi ....................... C23C 14/34 |
| | | 204/298.16 |
| 2021/0217618 A1* | 7/2021 | Takahashi ............... C23C 14/34 |
| 2021/0292227 A1* | 9/2021 | Sun ....................... C23C 14/352 |

FOREIGN PATENT DOCUMENTS

| JP | 2002256428 A | * | 9/2002 |
| JP | 2008270749 A | | 11/2008 |
| | (Continued) | | |

OTHER PUBLICATIONS

Translation to Saito (JP 2013125851) published Jun. 2013.*

(Continued)

*Primary Examiner* — John J Brayton
(74) *Attorney, Agent, or Firm* — Maier & Maier, PLLC

(57) ABSTRACT

A film formation method of a gallium nitride film according to an embodiment of the present invention includes the steps of placing a substrate so as to face a target containing nitride and gallium in a vacuum chamber, heating the substrate, supplying a sputtering gas to the vacuum chamber, supplying a nitrogen radical and a hydrogen radical to the vacuum chamber, and applying a voltage to the target to generate a plasma of the sputtering gas. Gallium nitride generated by a recombination reaction between the gallium sputtered from the target and the nitrogen radical, and gallium nitride generated by a recombination reaction between a gallium cation generated from the gallium of the target and a nitrogen anion generated from the nitrogen radical are deposited on the substrate.

8 Claims, 11 Drawing Sheets

(56)                    References Cited

FOREIGN PATENT DOCUMENTS

| | | | | |
|---|---|---|---|---|
| JP | 2013125851 | A | * | 6/2013 |
| JP | 2020147837 | A | | 9/2020 |
| JP | 2020164927 | A | | 10/2020 |
| WO | 2016009577 | A1 | | 1/2016 |
| WO | 2019167715 | A1 | | 9/2019 |

OTHER PUBLICATIONS

Translation to Kinokiri (JP 2002-256428 published Sep. 2002 . . . .*
English machine translation of the International Search Report
issued Jun. 27, 2023, in corresponding International Application No.
PCT/JP2023/014830, 3 pages.
English machine translation of Office Action dated Sep. 30, 2025,
issued in JP Appl. No. 2024-520309, 4 pages.

* cited by examiner

<u>1000</u>

FILM FORMATION APPARATUS AND FILM FORMATION METHOD OF GALLIUM NITRIDE FILM

CROSS-REFERENCE TO RELATED APPLICATIONS

This application is a Continuation of International Patent Application No. PCT/JP2023/014830, filed on Apr. 12, 2023, which claims the benefit of priority to Japanese Patent Application No. 2022-077637, filed on May 10, 2022, the entire contents of which are incorporated herein by reference.

FIELD

An embodiment of the present invention relates to a film formation apparatus for forming a gallium nitride film. Further, an embodiment of the present invention relates to a method for forming a gallium nitride film.

BACKGROUND

In a small or medium-sized display device such as a smart phone, a display using liquid crystals or OLEDs (Organic Light Emitting Diodes) has been commercialized. In particular, an OLED display device using the OLEDs which are self-light emitting elements has the advantages of high-contrast and does not require a backlight, as compared with a liquid crystal display device. However, since the OLEDs are composed of organic compounds, it is difficult to secure high reliability of the OLED display device due to deterioration of the organic compounds.

In recent years, a so-called micro LED display device and a mini LED display device in which minute LED chips are mounted in pixels of a circuit substrate have been developed as next-generation display devices. The LED is a self-light emitting element similar to the OLED, but unlike OLED, the LED is composed of stable inorganic compounds containing gallium (Ga) or indium (In), and therefore, it is easy to ensure high reliability of the micro LED display device as compared with the OLED display device. In addition, the LED has high light emission efficiency and high brightness can be realized. Therefore, the micro LED display device is expected to be a next-generation display with high reliability, high brightness, and high contrast.

A gallium nitride film used in the micro LED and the like is generally formed on a sapphire substrate by Metal Organic Chemical Vapor deposition (MOCVD) or Hydride Vapor Phase Epitaxy (HVPE) at a high temperature of 800° C. to 1000° C. Recently, however, the deposition of the gallium nitride film by sputtering, which can be deposited at relatively low temperatures, has been developed (for example, see Japanese laid-open patent publication No. 2020-164927).

SUMMARY

A film formation apparatus according to an embodiment of the present invention includes a vacuum chamber capable of evacuating an interior thereof, a substrate support portion provided in the vacuum chamber and configured to support a substrate, a target support portion provided in the vacuum chamber and configured to support a target containing nitrogen and gallium, a sputtering gas supply unit connected to the vacuum chamber and configured to supply a sputtering gas to the vacuum chamber, a sputtering power supply configured to apply a voltage to the target and generate a plasma of the sputtering gas supplied to the vacuum chamber, a first radical supply source connected to the vacuum chamber and configured to be capable of supplying a nitrogen radical and a hydrogen radical to the vacuum chamber, a second radical supply source connected to the vacuum chamber and configured to be capable of supplying a chlorine radical to the vacuum chamber, and a control unit configured to control at least one of the sputtering gas supply unit, the sputtering power supply, the first radical supply source, and the second radical supply source.

A film formation method of a gallium nitride film according to an embodiment of the present invention includes the steps of placing a substrate so as to face a target containing nitride and gallium in a vacuum chamber, heating the substrate, supplying a sputtering gas to the vacuum chamber, supplying a nitrogen radical and a hydrogen radical to the vacuum chamber, and applying a voltage to the target to generate a plasma of the sputtering gas. Gallium nitride generated by a recombination reaction between the gallium sputtered from the target and the nitrogen radical, and gallium nitride generated by a recombination reaction between a gallium cation generated from the gallium of the target and a nitrogen anion generated from the nitrogen radical are deposited on the substrate.

DESCRIPTION OF EMBODIMENTS

Figure 1:
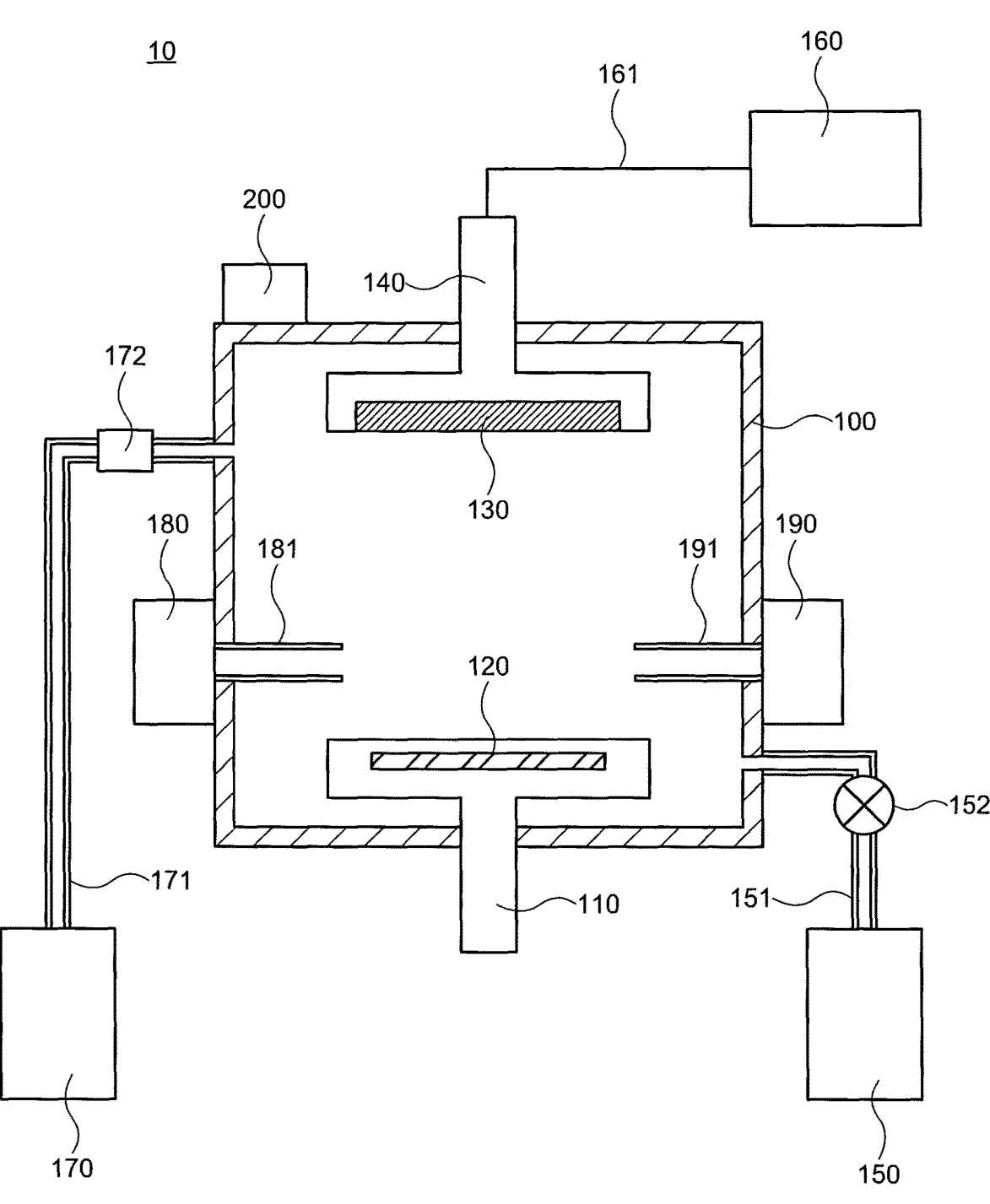
FIG. 1 is a schematic diagram showing a configuration of a film formation apparatus according to an embodiment of the present invention.

When a gallium nitride film is formed at a low temperature, it is possible to form a micro-LED directly on a glass substrate. However, it has not been possible to obtain a gallium nitride film with sufficient quality formed by sputtering.

In view of the above problems, an embodiment of the present invention can provide a film formation apparatus that can form a gallium nitride film at a low temperature. Further, an embodiment of the present invention can provide a method for forming a high-quality gallium nitride film.

Hereinafter, each of the embodiments of the present invention is described with reference to the drawings. Each of the embodiments is merely an example, and a person skilled in the art could easily conceive of the invention by appropriately changing the embodiment while maintaining the gist of the invention, and such changes are naturally included in the scope of the invention. For the sake of clarity of the description, the drawings may be schematically represented with respect to the widths, thicknesses, shapes, and the like of the respective portions in comparison with actual embodiments. However, the illustrated shapes are merely examples and are not intended to limit the interpretation of the present invention.

In the present specification, the expression "a includes A, B, or C," "a includes any of A, B, or C," "a includes one selected from a group consisting of A, B and C," and the like does not exclude the case where a includes a plurality of combinations of A to C unless otherwise specified. Further, these expressions do not exclude the case where a includes other components.

In the present specification, although the phrase "on" or "over" or "under" or "below" is used for convenience of explanation, in principle, the direction from a substrate toward a structure is referred to as "on" or "over" with reference to a substrate in which the structure is formed. Conversely, the direction from the structure to the substrate is referred to as "under" or "below." Therefore, in the expression of "a structure over a substrate," one surface of the structure in the direction facing the substrate is the bottom surface of the structure and the other surface is the upper surface of the structure. In addition, the expression of "a structure over a substrate" only explains the vertical relationship between the substrate and the structure, and another member may be placed between the substrate and the structure. Furthermore, the term "on" or "over" or "under" or "below" means the order of stacked layers in the structure in which a plurality of layers is stacked, and may not be related to the position in which layers overlap in a plan view.

In the specification, terms such as "first", "second", or "third" attached to each configuration are convenient terms used to distinguish each component, and have no further meaning unless otherwise explained.

In the specification and the drawings, the same reference numerals may be used when multiple components are identical or similar in general, and reference numerals with a lower or upper case letter of the alphabet may be used when the multiple components are distinguished. Further, reference numerals with a hyphen and a natural number may be used when multiple portions of one component are distinguished.

In the specification, a cation and an anion may be referred to as a positive ion and a negative ion, respectively.

The following embodiments can be combined with each other as long as there is no technical contradiction.

First Embodiment

A film formation apparatus of a gallium nitride film according to an embodiment of the present invention will be described with reference to FIGS. 1 and 2.

FIG. 1 is a schematic diagram showing a configuration of a film formation apparatus 10 according to an embodiment of the present invention.

As shown in FIG. 1, the film formation apparatus 10 includes a vacuum chamber 100, a substrate support portion 110, a heating unit 120, a target 130, a target support portion 140, a pump 150, a sputtering power supply 160, a sputtering gas supply unit 170, a first radical supply source 180, a second radical supply source 190, and a control unit 200.

The substrate support portion 110, the heating unit 120, the target 130, and the target support portion 140 are provided in the vacuum chamber 100. The substrate support portion 110 and the heating unit 120 are provided at a lower part in the vacuum chamber 100. A substrate is placed on the substrate support portion 110. The heating unit 120 is provided in the substrate support 110 and is capable of heating the substrate placed on the substrate support portion 110. The target 130 and the target support portion 140 are provided at an upper part in the vacuum chamber 100. The target 130 is supported by the target support portion 140 and is provided to face the substrate placed on the substrate support portion 110.

In addition, although FIG. 1 shows a configuration in which the substrate support portion 110 and the heating unit 120 are provided at the lower part in the vacuum chamber 100 and the target 130 and the target support portion 140 are provided at the upper part in the vacuum chamber 100, these positions may be reversed.

The target 130 is gallium nitride containing nitrogen and gallium. In the composition ratio of the gallium nitride in the target 130, it is preferable that gallium for nitrogen is greater than or equal to 0.7 and less than or equal to 2. The nitrogen of the gallium nitride film formed on the substrate is supplied from the target 130 and the first radical supply source 180, while the gallium of the gallium nitride film is supplied only from the target 130. Therefore, it is more preferable that the composition of the gallium nitride of the target 130 is more gallium than nitrogen. Further, the target support portion 140 is preferably an yttria-based material having corrosion resistance to chlorine, which is an etching gas (a second gas) described later.

The pump 150, the sputtering power supply 160, the sputtering gas supply unit 170, the first radical supply source 180, and the second radical supply source 190 are provided outside the vacuum chamber 100.

The pump 150 is connected to the vacuum chamber 100 through a pipe 151. The pump 150 can exhaust gas from the vacuum chamber 100 through the pipe 151. That is, the inside of the vacuum chamber 100 can be evacuated by the pump 150 connected to the vacuum chamber 100. Further, the pressure in the vacuum chamber 100 can be kept constant by opening and closing a valve 152 connected to the pipe 151. For example, a turbo molecular pump or a cryopump can be used as the pump 150.

The sputtering power supply 160 is electrically connected to the target 130 via wiring 161. The sputtering power supply 160 can generate a direct current voltage (DC voltage) or an alternating current voltage (AC voltage) and apply the generated voltage to the target 130. The frequency of the AC voltage is 13.56 MHz. The sputtering power supply 160 can also apply a bias voltage to the target 130 and further apply a DC voltage or an AC voltage.

The sputtering power supply 160 may periodically change a voltage applied to the target 130. For example, a voltage is applied to the target 130 for a period of 50 μsec to 10 msec, and then the application of the voltage to the target 130 may be stopped for a period of 2 μsec to 10 msec. In the film formation apparatus 10 according to the present embodiment, a period in which a voltage is applied to the target 130 and a period in which the application of the voltage to the target 130 is stopped are repeated to form a gallium nitride film. In the following description, a state in which a voltage is applied to the target 130 may be referred to as an "on-state of the sputtering power supply 160", and a state in which a voltage is not applied to the target 130 may be referred to as an "off-state of the sputtering power supply 160."

The sputtering gas supply unit 170 is connected to the vacuum chamber 100 through a pipe 171. The sputtering gas supply unit 170 can supply a sputtering gas into the vacuum chamber 100 through the pipe 171. Further, the flow rate of the sputtering gas can be controlled by a mass flow controller 172 connected to the pipe 171. Argon (Ar) or krypton (Kr) can be used as the sputtering gas supplied from the sputtering gas supply unit 170.

The first radical supply source 180 is connected to a pipe 181 provided in the vacuum chamber 100, and can supply nitrogen radicals and hydrogen radicals into the vacuum chamber 100. The pipe 181 may be provided with one end facing the substrate support part 110. In this case, nitrogen radicals and hydrogen radicals can be irradiated from one end of the pipe 181 toward a substrate placed on the substrate support portion 110. Although details are described later, the first radical supply source 180 can generate nitrogen radicals by turning a first gas containing nitrogen into a plasma.

The second radical supply source 190 is connected to a pipe 191 provided in the vacuum chamber 100, and can supply chlorine radicals into the vacuum chamber 100. The pipe 191 may be provided such that one end of the pipe 191 faces the substrate support portion 110. In this case, chlorine radicals can be irradiated from one end of the pipe 191 toward the substrate placed on the substrate support portion 110. Although details are described later, the second radical supply source 190 can generate chlorine radicals by turning a second gas containing chlorine into a plasma.

In addition, the first radical source 180 may be provided in the vacuum chamber 100 and generate nitrogen radicals in the vacuum chamber 100. Similarly, the second radical source 190 may be provided in the vacuum chamber 100 and generate chlorine radicals in the vacuum chamber 100.

The control unit 200 can control the operation of the film formation apparatus 10 in forming the gallium nitride film. The control unit 200 is a computer that can perform arithmetic processing using data or information, and includes, for example, a central processing unit (CPU), a microprocessor (MPU), or a random access memory (RAM). Specifically, the control unit 200 executes a predetermined program to control the operation of the film formation apparatus 10. Here, the details of the control of the control unit 200 are described with reference to FIG. 2.

Figure 2:
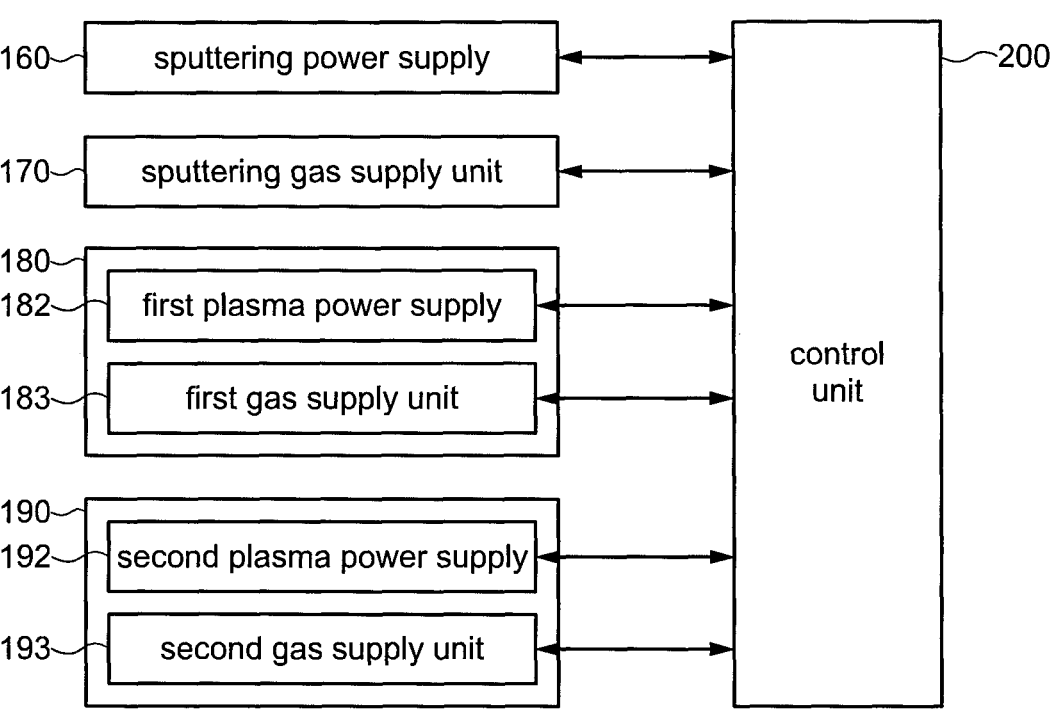
FIG. 2 is a block diagram showing connections of a control unit of a film formation apparatus according to an embodiment of the present invention.

FIG. 2 is a block diagram showing connections in the control unit 200 of the film formation apparatus 10 according to an embodiment of the present invention.

As shown in FIG. 2, the control unit 200 is connected to the sputtering power supply 160 and the sputtering gas supply unit 170. Therefore, the control unit 200 can control the on- or off-state of the sputtering power supply 160 and the start or stop of the supply of the sputtering gas to the vacuum chamber 100. In addition, although FIG. 2 shows a configuration in which the control unit 200 is connected to the sputtering gas supply unit 170, the control unit 200 may be connected to the mass flow controller 172 to control the start or stop of the supply of the sputtering gas by the mass flow controller 172.

Further, the control unit 200 is connected to a first plasma power supply 182 and a first gas supply unit 183 included in the first radical supply source 180. Therefore, the control unit 200 can control the on- or off-state of the first plasma power supply 182 and the start or stop of the supply of the first gas. The first plasma power supply 182 turns the first gas supplied from the first gas supply unit 183 into a plasma. Therefore, when the control unit 200 starts the supply of the first gas and controls the first plasma power supply 182 to be in the on-state, the radicals of the first gas are supplied from the first radical supply source 180 to the vacuum chamber 100. The first gas is a gas containing nitrogen and hydrogen, such as a nitrogen/hydrogen mixed gas ($N_2/H_2$ mixed gas) or ammonia gas ($NH_3$ gas). Therefore, nitrogen radicals and hydrogen radicals are supplied from the first radical supply source 180 to the vacuum chamber 100 as the radicals of the first gas. In addition, when the control unit 200 starts the supply of the first gas and controls the first plasma power supply 182 to be in the off-state, the first gas may be supplied from the first radical supply source 180 to the vacuum chamber 100.

Furthermore, the control unit 200 is connected to a second plasma power supply 192 and a second gas supply unit 193 included in the second radical supply source 190. Therefore, the control unit 200 can control the on- or off-state of the second plasma power supply 192 and the start or stop of the supply of the second gas. The second plasma power supply 192 turns the second gas supplied from the second gas supply unit 193 into a plasma. Therefore, when the control unit 200 starts the supply of the second gas and controls the second plasma power supply 192 to be in the on-state, the radicals of the second gas are supplied from the second radical supply source 190 to the vacuum chamber 100. The second gas is a gas containing chlorine, such as chlorine gas ($Cl_2$ gas) or boron trichloride gas ($BCl_3$ gas). Therefore, chlorine radicals are supplied from the second radical supply source 190 to the vacuum chamber 100 as the second radicals. In addition, when the control unit 200 starts the supply of the second gas and controls the second plasma power supply 192 to be in the off-state, the second gas may be supplied from the second radical supply source 190 to the vacuum chamber 100.

The control unit 200 may control the pump 150 so that a predetermined pressure is maintained in the vacuum chamber 100. Further, the control unit 200 may control the heating unit 120 so that the substrate placed on the substrate support portion 110 is heated at a predetermined temperature.

Although details are described later, it is possible to form a high-quality gallium nitride film on a substrate even at a low substrate temperature of 400° C. to 600° C. in the film formation apparatus 10 according to an embodiment of the present invention by repeatedly perform a gallium nitride film formation process, an etching process, and an impurity reduction process using nitrogen radicals, hydrogen radicals, and chlorine radicals.

In addition, the film formation apparatus 10 can also form nitride films other than a gallium nitride film by using materials other than gallium nitride for the target 130.

Second Embodiment

A method for forming a gallium nitride film according to an embodiment of the present invention is described with reference to FIGS. 3 and 4. Since the gallium nitride film described in the present embodiment is formed using the film formation apparatus 10, the following description may refer to the reference symbols shown in FIGS. 1 and 2 for convenience.

Figure 3:
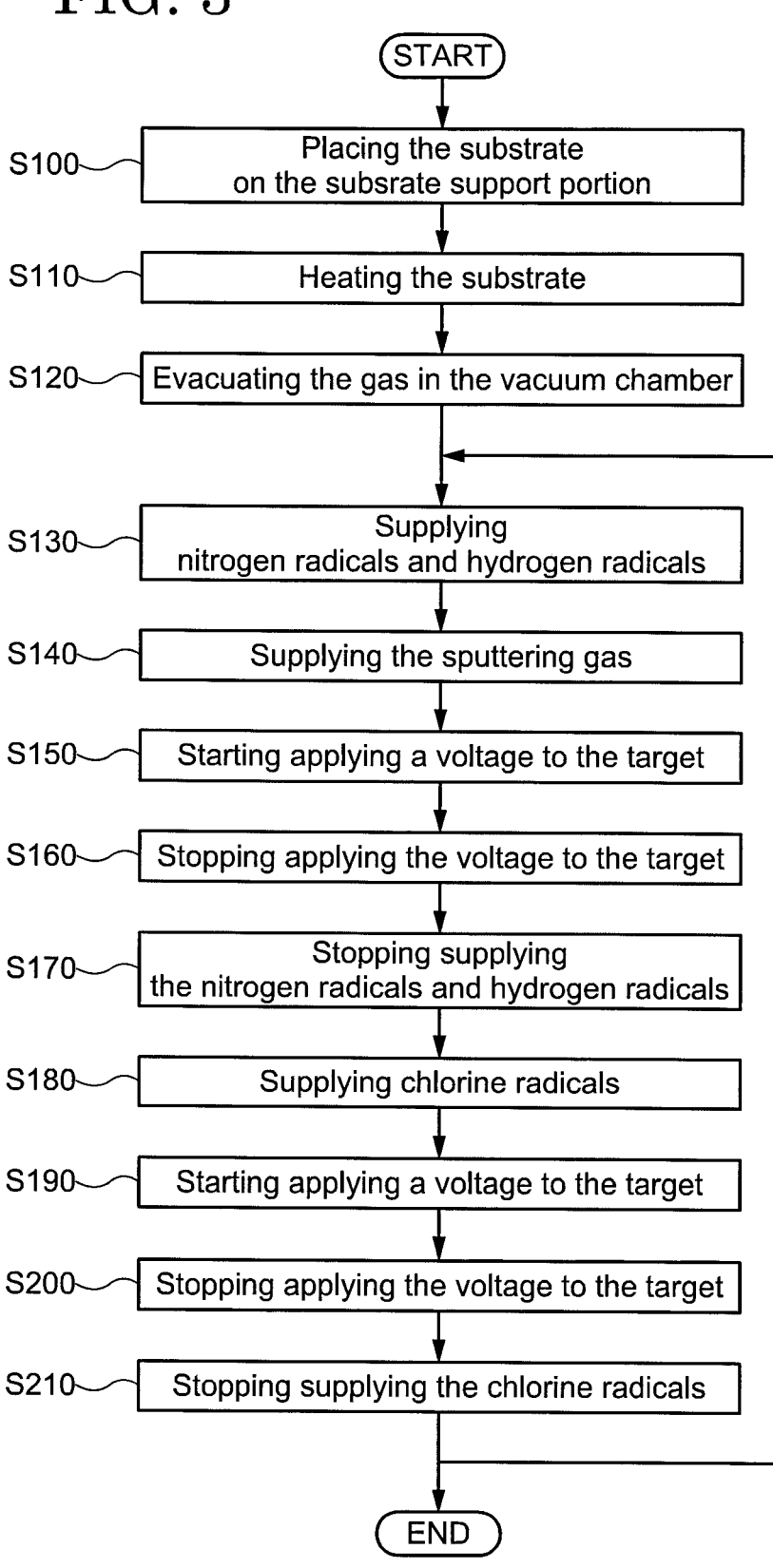
FIG. 3 is a flow chart showing a method for forming a gallium nitride film according to an embodiment of the present invention.

FIG. 3 is a flow chart showing a method for forming a gallium nitride film according to an embodiment of the present invention. In the method for forming the gallium nitride film as shown in FIG. 3, steps S100 to S210 are sequentially performed.

In step S100, the substrate is placed on the substrate support portion 110 so as to face the target 130. In the film formation apparatus 10, a glass substrate or a quartz substrate can be used as the substrate, for example. Further, a glass substrate or a quartz substrate on which an aluminum nitride film is formed can be used as the substrate.

In step S110, the substrate is heated at a predetermined temperature by the heating unit 120. For example, the predetermined temperature is greater than or equal to 400° C. and less than or equal to 600° C.

In step S120, the pump 150 evacuates the gas in the vacuum chamber 100 so as to be less than or equal to a predetermined degree of vacuum. For example, although the predetermined degree of vacuum is $1 \times 10^{-6}$ Pa, the predetermined degree of vacuum is not limited thereto.

In step S130, the first radical supply source 180 is controlled to supply the nitrogen radicals and the hydrogen radicals from the first radical supply source 180 to the vacuum chamber 100.

In step S140, the sputtering gas supply unit 170 is controlled to supply the sputtering gas from the sputtering gas supply unit 170 to the vacuum chamber 100. The flow rate of the sputtering gas is adjusted by the mass flow controller 172 so that the pressure in the vacuum chamber 100 becomes a predetermined pressure. For example, the predetermined pressure is greater than or equal to 0.1 Pa and less than or equal to 10 Pa.

In step S150, the sputtering power supply 160 is controlled to start applying a predetermined voltage to the target 130 so that the target 130 becomes a cathode relative to the substrate (the sputtering power supply 160 is in the on-state). Thus, the sputtering gas supplied to the vacuum chamber 100 is turned into a plasma, and then positive ions and electrons of the sputtering gas are generated. The ions of the sputtering gas are accelerated by the potential difference between the substrate and the target 130 and collide with the target 130. As a result, sputtered gallium and gallium positive ions are released from the target 130.

In step S150, the nitrogen radicals are supplied from the first radical supply source 180 to the vacuum chamber 100. Therefore, the gallium released from the target 130 recombines and reacts with the nitrogen radical to generate gallium nitride. The generated gallium nitride is deposited on the substrate to form a gallium nitride film.

Further, in step S150, gallium nitride is generated by another recombination reaction. Nitrogen has a large electronegativity and easily attracts an electron. Therefore, the nitrogen radical reacts with an electron in the vacuum chamber 100 to generate a nitrogen anion. The produced nitrogen anion recombines and reacts with the gallium cation present close to the substrate to generate gallium nitride. The generated gallium nitride is deposited on the substrate to form the gallium nitride film. Since the recombination reaction of the cation and the anion is a reaction that releases a large amount of energy, the gallium nitride film can be formed on the substrate even when the substrate temperature is low.

In addition, oxygen may remain in the vacuum chamber 100. In this case, the gallium cation reacts with the residual oxygen in the vacuum chamber 100 to generate gallium oxide. When gallium oxide is generated, the growth of the gallium nitride film is inhibited, so that the residual oxygen in the vacuum chamber 100 is preferably reduced as much as possible. In step S150, not only nitrogen radicals but also hydrogen radicals are supplied to the vacuum chamber 100. The hydrogen radical reacts with the residual oxygen to generate water (water vapor). The generated water vapor is exhausted from the vacuum chamber 100 by the pump 150. That is, since the residual oxygen in the vacuum chamber 100 is reduced in the film formation apparatus 10, the generation of gallium oxide is suppressed, so that the gallium nitride film formed on the substrate is a high-quality film.

As described above, hydrogen radicals have the effect of removing residual oxygen that inhibits the generation of gallium nitride. Further, the hydrogen radical may react with the gallium cation to generate a gallium hydride cation. The gallium hydride cation is highly reactive and easily reacts with the nitrogen anion to generate gallium nitride. Therefore, hydrogen radicals also have the effect of promoting the production of gallium nitride.

In step S160, the sputtering power supply 160 is controlled to stop applying the voltage to the target 130 (the sputtering power supply 160 is in the off-state). Thus, although the plasma disappears, the film formation apparatus 10 can still generate gallium nitride in this state. Specifically, in step S160, gallium nitride can be generated using a metastable state of the sputtering gas (rare gas). Here, the generation of gallium nitride in step S160 is described in detail.

It is known that rare gas atoms in a metastable state with a long lifetime exist in the plasma of the rare gas. For example, metastable energies of an argon atom and a krypton atom are 11.61 eV and 9.91 eV, respectively. Such metastable argon or krypton atoms are generated in the plasma of sputtering, and can exist even after the plasma disappears due to their long lifetime. That is, the metastable argon or krypton atoms can exist even after the application of the voltage to the target 130 is stopped.

After the application of the voltage to the target 130 is stopped, not only nitrogen radicals but also nitrogen molecules are present in the vacuum chamber 100. The dissociation energy from the nitrogen molecule to the nitrogen atom due to the collision of electrons is 9.756 eV, which is close to the metastable energy of the argon atom or krypton atom. Therefore, when the nitrogen molecule collides with the argon atom or krypton atom in the metastable state, a dissociation reaction of the nitrogen molecule occurs to generate a nitrogen radical. That is, even after the application of the voltage to the target 130 is stopped, nitrogen radicals are generated by the argon atom or krypton atom in the metastable state. As described above, since the electronegativity of nitrogen is large, the nitrogen radical reacts with an electron in the vacuum chamber 100 to generate a nitrogen anion. Further, in step S160, the nitrogen radicals are supplied from the first radical supply source 180 to the vacuum chamber 100. The supplied nitrogen radical reacts with the electrons in the vacuum chamber 100 to generate a nitrogen anion. Then, the nitrogen anion recombines with the gallium cation present close to the substrate to generate gallium nitride, which is deposited on the substrate to form the gallium nitride film.

Therefore, in step S160, by using not only the nitrogen radicals supplied from the first radical supply source 180 but also the metastable argon atoms or krypton atoms, gallium nitride can be generated efficiently.

In step S170, the first radical supply source 180 is controlled to stop the supply of nitrogen radicals and hydrogen radicals to the vacuum chamber 100.

In step S180, the second radical supply source 190 is controlled, and chlorine radicals are supplied from the second radical supply source 190 to the vacuum chamber 100. The gallium nitride film formed in steps S150 and S160 includes not only crystalline regions but also amorphous regions. Therefore, in step S180, the chlorine radicals are used to etch the amorphous regions of the gallium nitride film. This etching can improve the crystallinity of the gallium nitride film formed on the substrate. In addition, the amorphous regions have weaker bonds between gallium and nitrogen than the crystalline regions. Therefore, selective etching of the amorphous regions is possible. Further, the boiling point of gallium chloride generated by etching is about 200° C. Therefore, since the gallium chloride close to the substrate heated at a temperature higher than or equal to 400° C. is a gas, the gallium chloride is not deposited on the substrate.

In step S190, the sputtering power supply 160 is controlled to start applying a predetermined voltage to the target 130 so that the target 130 becomes a cathode relative to the substrate (the sputtering power supply 160 is in the on-state). Thus, the chlorine radicals supplied to the vacuum chamber 100 are turned into a plasma. Chlorine has a large electronegativity and easily attracts an electron. Therefore, the chlorine radical reacts with an electron in the plasma to generate a chlorine anion. Therefore, in step S190, the amorphous region of the gallium nitride film can be etched using not only the chlorine radicals but also the chlorine anions. Therefore, the amorphous region of the gallium nitride film can be efficiently etched.

In step S200, the sputtering power supply 160 is controlled to stop applying the voltage to the target 130 (the sputtering power supply 160 is in the off-state).

In step S210, the second radical supply source 190 is controlled to stop the supply of the chlorine radicals to the vacuum chamber 100.

In the method for forming a gallium nitride film according to the present embodiment, a high-quality gallium nitride film with improved crystallinity can be formed on the substrate by repeating steps S130 to S210. Here, the details of a timing of control by the control unit 200 are described with reference to FIG. 4.

Figure 4:
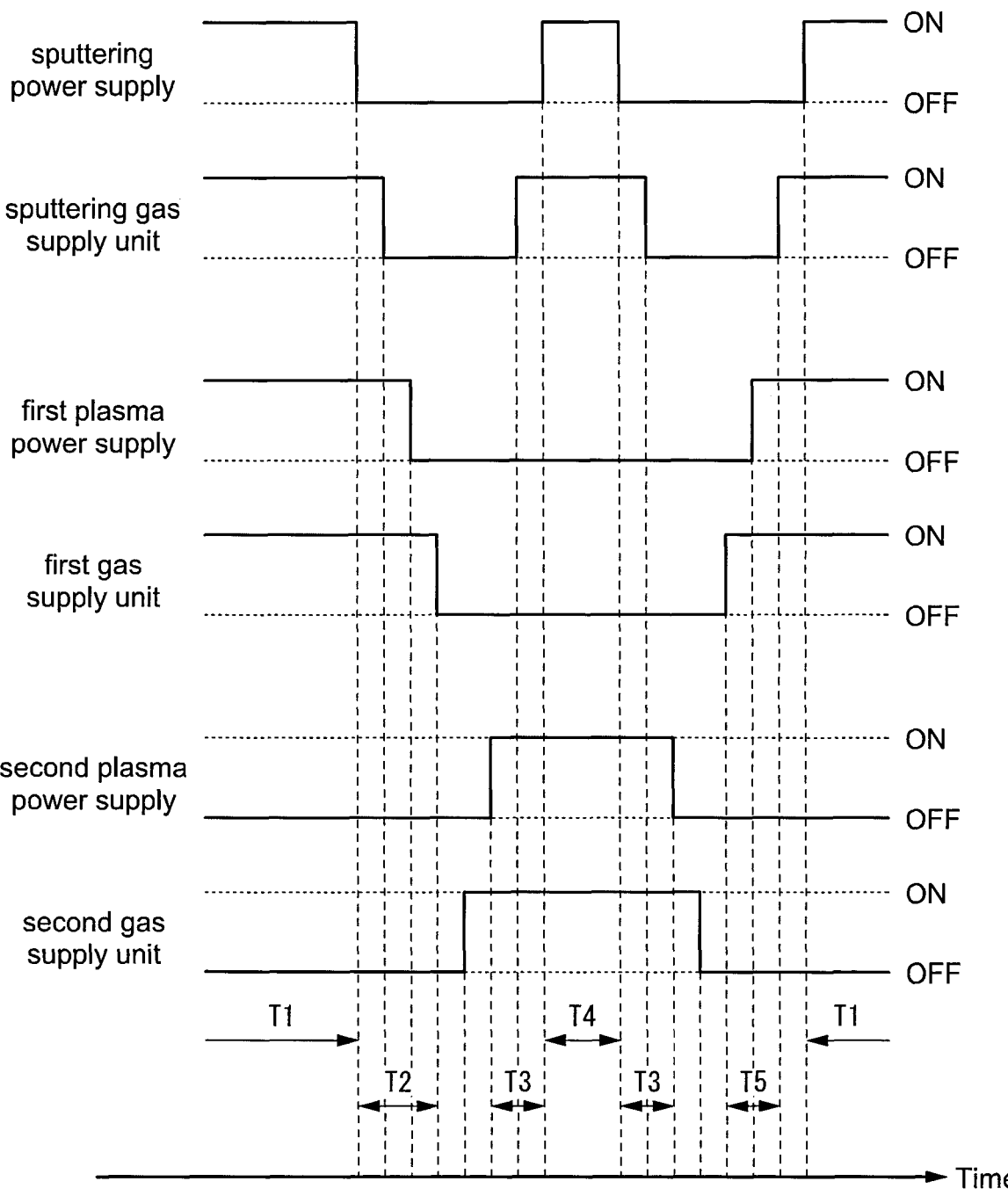
FIG. 4 is a sequence diagram showing a timing of control by a control unit in a method for forming a gallium nitride film according to an embodiment of the present invention.

FIG. 4 is a sequence diagram showing the timing of control by the control unit 200 in the method for forming a gallium nitride film according to an embodiment of the present invention. In addition, the sequence diagram shown in FIG. 4 is an example, and the control by the control unit 200 is not limited thereto. Some modifications are described later.

FIG. 4 shows a first period T1 to a fifth period T5 related to the film formation process of the gallium nitride film. In the first period T1 and the fourth period T4, the sputtering power supply 160 is in the on-state, and in the second period T2, the third period T3, and the fifth period T5, the sputtering power supply 160 is in the off-state. The period during which the sputtering power supply 160 is in the on-state (the on-period of the sputtering power supply 160) is, for example, greater than or equal to 50 μsec and less than or equal to 10 msec. It is preferable that the on-period of the sputtering power supply 160 is greater than or equal to 50 μsec in order to stabilize the plasma. Further, the period during which the sputtering power supply 160 is in the off-state (the off-period of the sputtering power supply 160) is, for example, greater than or equal to 2 μsec and less than or equal to 10 msec. It is preferable that the off-period of the sputtering power supply 160 is longer than the lifetime of the sputtering gas in a metastable state.

(First Period T1)

The first period T1 is the on-period of the sputtering power supply 160. In the first period T1, the sputtering gas is supplied from the sputtering gas supply unit 170 to the vacuum chamber 100. Further, the first gas is supplied from the first gas supply unit 183, and the first plasma power supply 182 is in the on-state. That is, in the first radical supply source 180, nitrogen radicals and hydrogen radicals are generated, and the generated nitrogen radicals and hydrogen radicals are supplied to the vacuum chamber 100. On the other hand, the supply of the second gas from the second gas supply unit 193 is stopped, and the second plasma power supply 192 is in the off-state. That is, in the second radical supply source 190, chlorine radicals are not generated, and chlorine radicals are not supplied to the vacuum chamber 100.

In the first period T1, the above-described step S150 is performed. That is, in the first period T1, the sputtering gas supplied to the vacuum chamber 100 is turned into a plasma, and positive ions and electrons of the sputtering gas are generated. The positive ions of the sputtering gas collide with the target 130, and gallium and gallium positive ions sputtered from the target 130 are released. The gallium released from the target 130 recombines and reacts with the nitrogen radical to generate gallium nitride. Further, the nitrogen radicals supplied to the vacuum chamber 100 react with the electrons to generate nitrogen negative ions. The generated nitrogen negative ion recombines and reacts with the gallium positive ion present close to the substrate to generate gallium nitride. The generated gallium nitride is deposited on the substrate to form the gallium nitride film.

(Second Period T2)

The second period T2 is included in the off-period of the sputtering power supply 160. In the second period T2, the supply of the sputtering gas from the sputtering gas supply unit 170 to the vacuum chamber 100 is stopped. Further, the first plasma power supply 182 changes to the off-state while the first gas is supplied from the first gas supply unit 183. Therefore, not only nitrogen radicals and hydrogen radicals but also the first gas containing nitrogen are supplied from the first radical supply source 180 to the vacuum chamber 100. In addition, the supply of the second gas from the second gas supply unit 193 is stopped, and the second plasma power supply 192 is in the off-state. That is, in the second radical supply source 190, chlorine radicals are not generated, and chlorine radicals are not supplied from the second radical supply source 190 to the vacuum chamber 100.

In the second period T2, the above-described step S160 is performed. That is, in the second period T2, gallium nitride is generated by a recombination reaction between the nitrogen anion and the gallium cation using the metastable sputtering gas. The generated gallium nitride is deposited on the substrate to form the gallium nitride film.

In the present embodiment, since the gallium nitride film is formed not only in the first period T1 but also in the second period T2, the film formation speed of the gallium nitride film can be improved.

(Third Period T3)

The third period T3 is included in the off-period of the sputtering power supply 160. In the third period T3, the second gas is supplied from the second gas supply unit 193, and the second plasma power supply 192 is in the on-state. That is, in the second radical supply source 190, chlorine radicals are generated, and the generated chlorine radicals are supplied to the vacuum chamber 100. Further, while the sputtering power supply 160 is maintained in the off-state, the supply of the sputtering gas from the sputtering gas supply unit 170 to the vacuum chamber 100 is started or stopped. In addition, the supply of the first gas from the first gas supply unit 183 is stopped, and the first plasma power supply 182 is in the off-state. That is, in the first radical supply source 180, nitrogen radicals and hydrogen radicals are not generated, and nitrogen radicals and hydrogen radicals are not supplied from the first radical supply source 180 to the vacuum chamber 100.

In the third period T3, the above-described step S180 is performed. That is, in the third period T3, etching of the amorphous regions of the gallium nitride film is performed using chlorine radicals.

(Fourth Period T4)

The fourth period T4 is the on-period of the sputtering power supply 160. In the fourth period T4, the sputtering gas is supplied from the sputtering gas supply unit 170 to the vacuum chamber 100. Further, the second gas is supplied from the second gas supply unit 193, and the second plasma power supply 192 is in the on-state. That is, in the second radical supply source 190, chlorine radicals are generated, and the generated chlorine radicals are supplied to the vacuum chamber 100. In addition, the supply of the first gas from the first gas supply unit 183 is stopped, and the first plasma power supply 182 is in the off-state. That is, in the first radical supply source 180, nitrogen radicals and hydrogen radicals are not generated, and nitrogen radicals and hydrogen radicals are not supplied from the first radical supply source 180 to the vacuum chamber 100.

In the fourth period T4, the above-described step S190 is performed. That is, in the fourth period T4, etching of the amorphous regions of the gallium nitride film is performed using chlorine radicals and chlorine anions.

In the present embodiment, since the amorphous regions of the gallium nitride film are etched not only in the third period T3 but also in the fourth period T4, the crystallinity of the gallium nitride film can be improved.

The length of the fourth period T4 may be the same as or different from the length of the first period T1.

(Fifth period T5)

The fifth period T5 is included in the off-period of the sputtering power supply 160. In the fifth period T5, the sputtering gas supply unit 170 starts supplying the sputtering gas to the vacuum chamber 100. Further, the first plasma power supply 182 is in the on-state while the first gas is supplied from the first gas supply unit 183. Therefore, nitrogen radicals and hydrogen radicals are supplied from the first radical supply source 180 to the vacuum chamber 100. In addition, the supply of the second gas from the second gas supply unit 193 is stopped, and the second plasma power supply 192 is in the off-state. That is, in the second radical supply source 190, chlorine radicals are not generated, and chlorine radicals are not supplied from the second radical supply source 190 to the vacuum chamber 100.

In the fifth period T5, the hydrogen radical supplied to the vacuum chamber 100 reacts with chlorine in the vacuum chamber 100 or in the gallium nitride film to generate hydrogen chloride. Since the generated hydrogen chloride is exhausted from the vacuum chamber 100 by the pump, the residual chlorine in the vacuum chamber 100 or in the gallium nitride film is reduced. That is, the hydrogen radicals in the fifth period T5 have the effect of removing chlorine, which is an impurity in the gallium nitride film, and reducing the impurity in the gallium nitride film. Therefore, the gallium nitride film becomes a high-quality film with a low impurity concentration.

According to the method for forming a gallium nitride film according to an embodiment of the present invention, when the first period T1 to the fifth period T5 are repeated, the gallium nitride film forming process, the amorphous region etching process, and the impurity reduction process are repeated. Therefore, the gallium nitride film formed on the substrate becomes a high crystallinity and high-quality film.

<Modification 1>

A modification of the method for forming a gallium nitride film according to an embodiment of the present invention is described with reference to FIG. 5. In addition, the description of the same configuration as that described in the Second Embodiment may be omitted in the following description.

Figure 5:
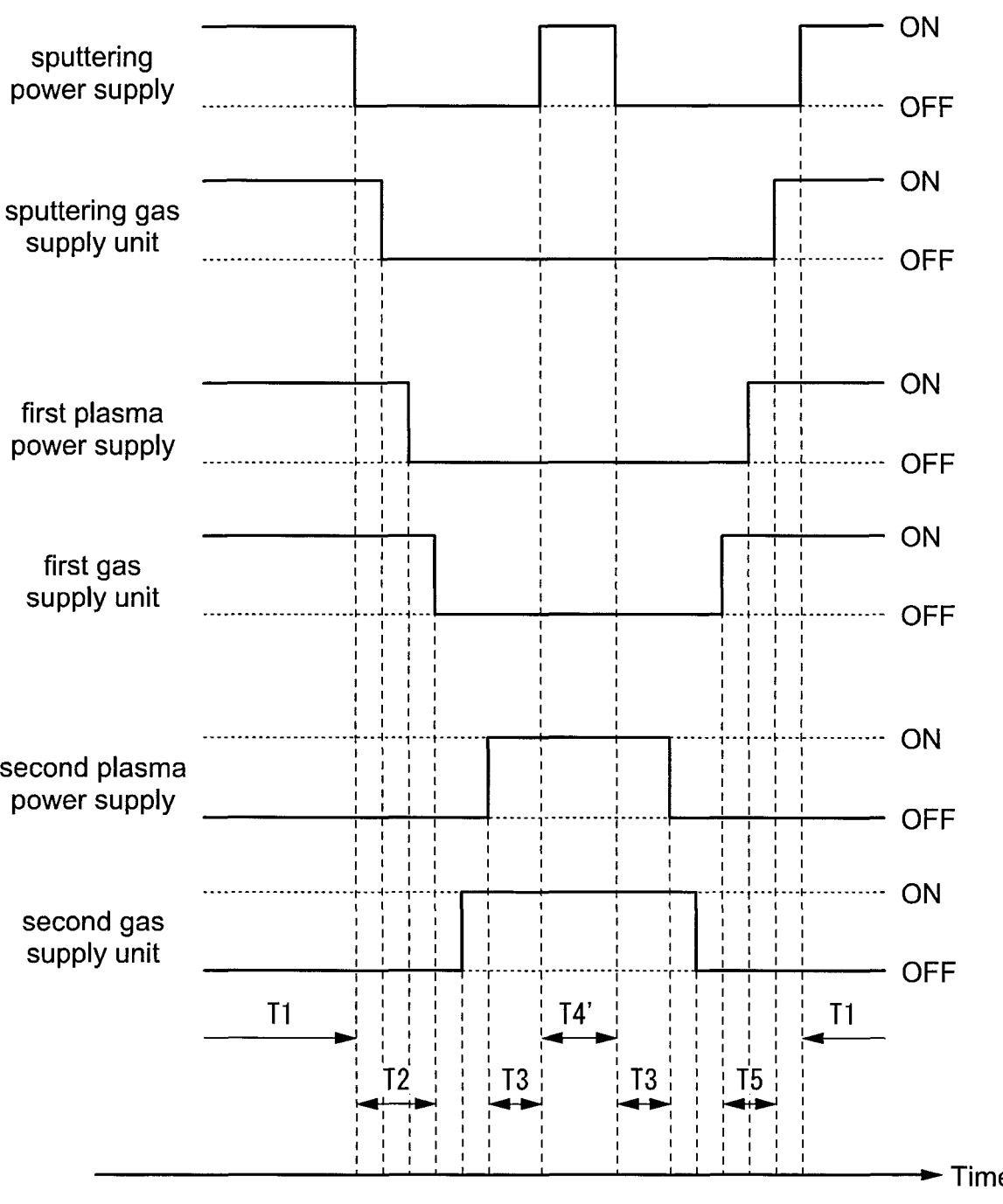
FIG. 5 is a sequence diagram showing a timing of control by a control unit in a method for forming a gallium nitride film according to an embodiment of the present invention.

FIG. 5 is a sequence diagram showing the timing of control by the control unit 200 in the method for forming a gallium nitride film according to an embodiment of the present invention. As shown in FIG. 5, the method for forming a gallium nitride film according to the present modification includes a fourth period T4'.

The fourth period T4' is the on-period of the sputtering power supply 160. In the fourth period T4', the sputtering gas is not supplied from the sputtering gas supply unit 170 to the vacuum chamber 100. When a plasma is stably formed by the supplied chlorine radicals, the sputtering gas does not need to be supplied to the vacuum chamber 100. Since the stable plasma is formed to generate chlorine radicals and chlorine anions, the amorphous regions of the gallium nitride film can be etched.

<Modification 2>

Another modification of the method for forming a gallium nitride film according to an embodiment of the present invention is described with reference to FIG. 6. In addition, the description of the same configuration as that described in the Second Embodiment may be omitted in the following description.

Figure 6:
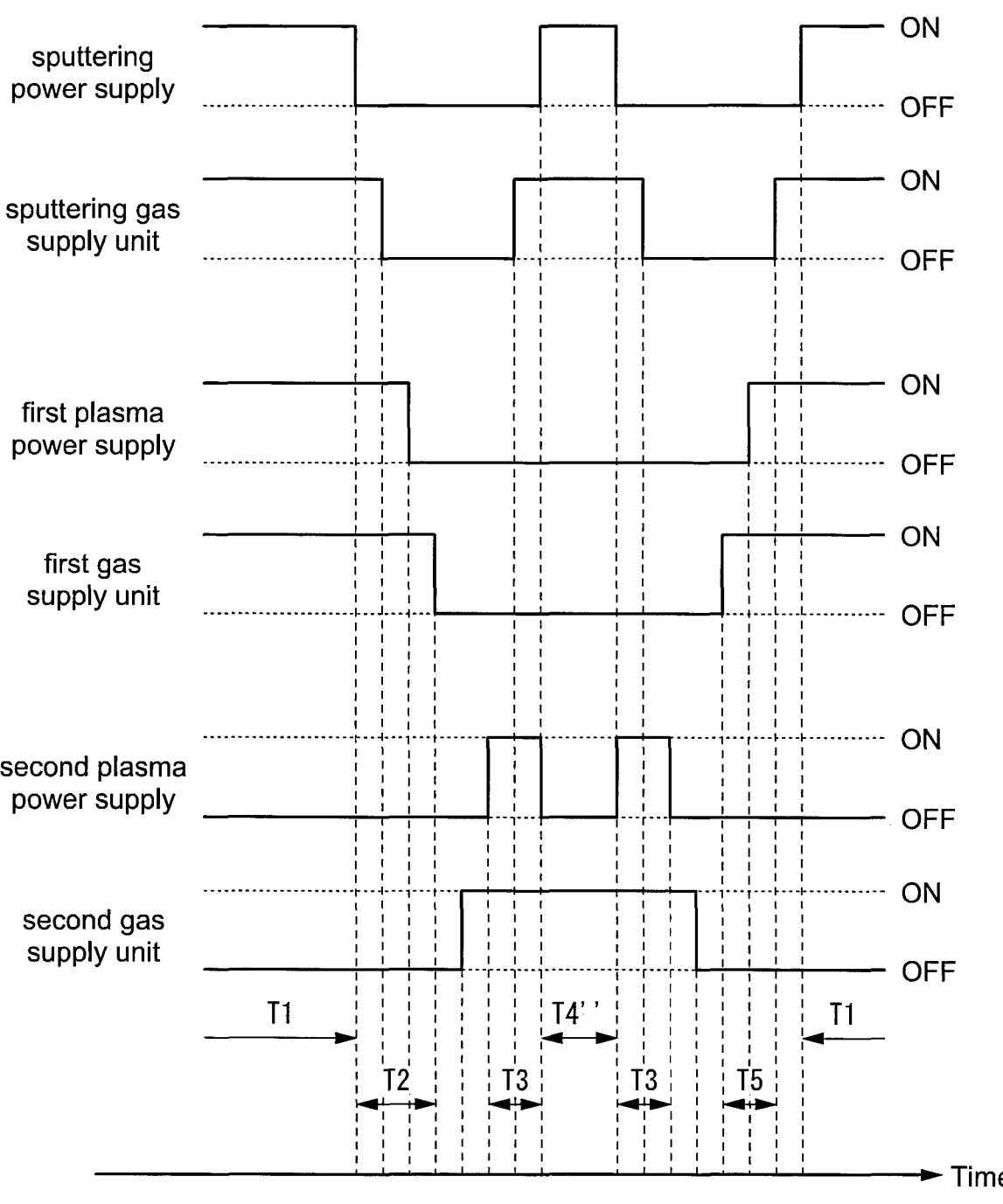
FIG. 6 is a sequence diagram showing a timing of control by a control unit in a method for forming a gallium nitride film according to an embodiment of the present invention.

FIG. 6 is a sequence diagram showing the timing of control by the control unit 200 in the method for forming a gallium nitride film according to an embodiment of the present invention. As shown in FIG. 6, the method for forming a gallium nitride film according to the present modification includes a fourth period T4".

The fourth period T4" is the on-period of the sputtering power supply 160. Although the second gas is supplied from the second gas supply unit 193 in the fourth period T4", the second plasma power supply 192 is in the off-state. Therefore, in the second radical supply source 190, chlorine radicals are not generated, and the second gas is supplied to the vacuum chamber 100. In the fourth period T4", the sputtering power supply 160 is in the on-state, so that the second gas supplied to the vacuum chamber 100 is turned into a plasma, and chlorine radicals and chlorine anions are generated. Therefore, the chlorine radicals and chlorine anions generated in the vacuum chamber 100 can be used to etch the amorphous regions of the gallium nitride film.

<Modification 3>

Another modification of the method for forming a gallium nitride film according to an embodiment of the present invention is described with reference to FIG. 7. In addition, the description of the same configuration as that described in the second embodiment may be omitted in the following description.

Figure 7:
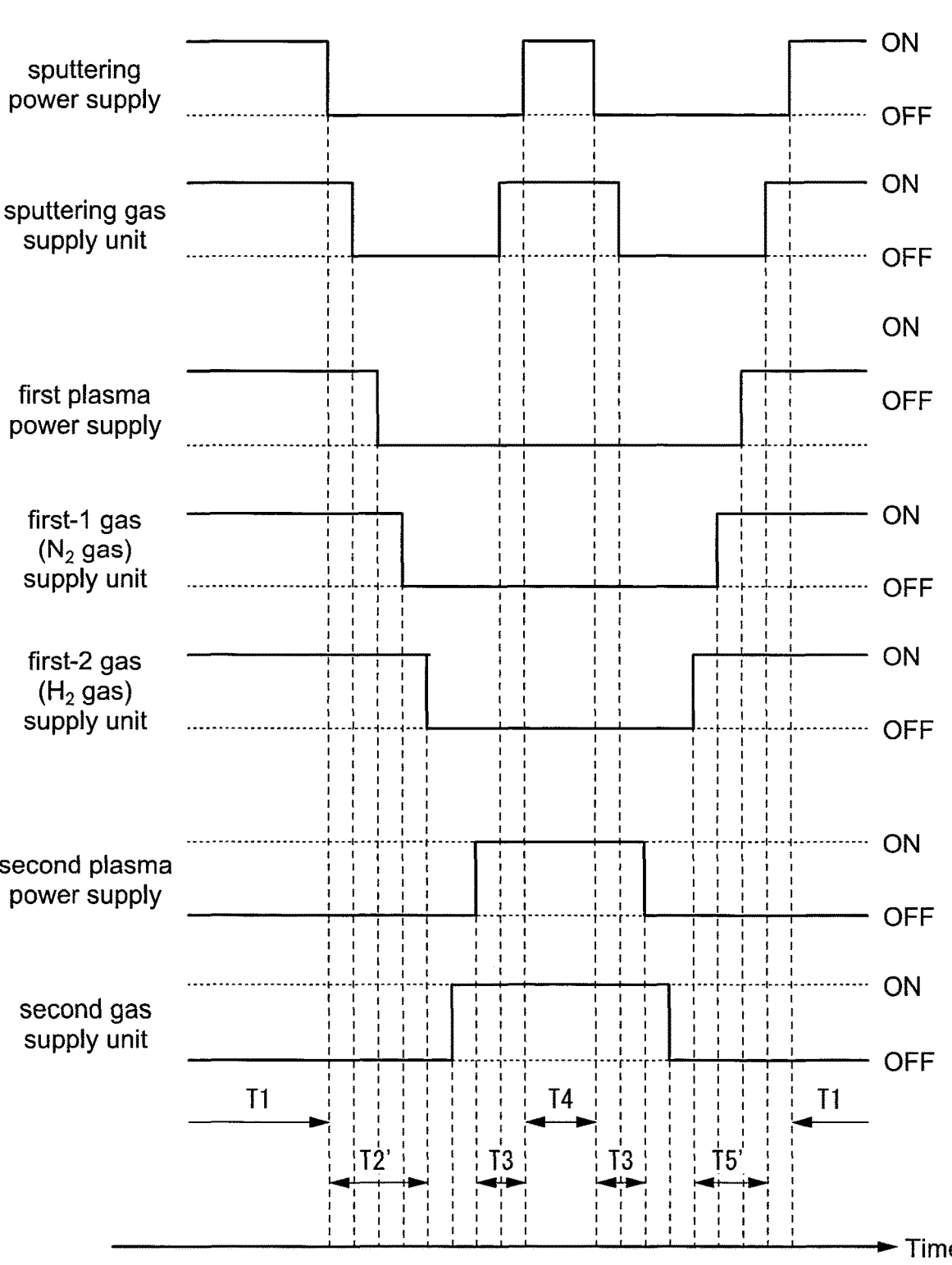
FIG. 7 is a sequence diagram showing a timing of control by a control unit in a method for forming a gallium nitride film according to an embodiment of the present invention.

FIG. 7 is a sequence diagram showing the timing of control by the control unit 200 in the method for forming a gallium nitride film according to an embodiment of the present invention. In the method for forming a gallium nitride film according to the present modification, although a nitrogen/hydrogen mixed gas ($N_2/H_2$ mixed gas) is used as the first gas, the nitrogen gas and the hydrogen gas are supplied from the first-1 gas supply unit and the first-2 gas supply unit, respectively. That is, the nitrogen gas and the hydrogen gas are supplied from separate gas supply units. Therefore, the control unit 200 can independently control the start or stop of the supply of the nitrogen gas, or the start or stop of the supply of the hydrogen gas. As shown in FIG. 7, the method for forming a gallium nitride film according to the present modification includes a second period T2' and a fifth period T5'.

The second period T2' is included in the off period of the sputtering power supply 160. In the second period T2', the supply of sputtering gas from the sputtering gas supply unit 170 to the vacuum chamber 100 is stopped. Further, the first plasma power supply 182 changes to the off-state while nitrogen gas and hydrogen gas are supplied from the first-1 gas supply unit and the first-2 gas supply unit, respectively. Therefore, not only nitrogen radicals and hydrogen radicals but also nitrogen gas and hydrogen gas are supplied to the vacuum chamber 100. In addition, the supply of the second gas from the second gas supply unit 193 is stopped, and the second plasma power supply 192 is in the off-state. That is, in the second radical supply source 190, chlorine radicals are not generated, and chlorine radicals are not supplied from the second radical supply.

Further, in the second period T2', the supply of hydrogen gas from the first-2 gas supply unit is stopped after the supply of nitrogen gas from the first-1 gas supply unit is stopped. According to this control, in the off-period of the sputtering power supply 160, it is possible to promote surface migration of hydrogen to the gallium deposited on the substrate surface. That is, by terminating the gallium on the substrate surface with hydrogen, it is possible to suppress the generation of gallium oxide on the substrate surface. Further, it is possible to improve the flatness of the formed gallium nitride film.

The fifth period T5' is included in the off-period of the sputtering power supply 160. In the fifth period T5', the sputtering gas supply unit 170 starts supplying the sputtering gas to the vacuum chamber 100. Further, the first plasma power supply 182 is turned on while the nitrogen gas and the hydrogen gas are supplied from the first-1 gas supply unit and the first-2 gas supply unit, respectively. Therefore, nitrogen radicals and hydrogen radicals are supplied to the vacuum chamber 100. In addition, the supply of the second gas from the second gas supply unit 193 is stopped, and the second plasma power supply 192 is in the off-state. That is, in the second radical supply source 190, chlorine radicals are not generated, and chlorine radicals are not supplied from the second radical supply source 190 to the vacuum chamber 100.

Further, in the fifth period T5', the supply of nitrogen gas from the first-1 gas supply unit is started after the supply of hydrogen gas from the first-2 gas supply unit is started. According to this control, in the off-period of the sputtering power supply 160, it is possible to efficiently remove chlorine remaining on the substrate surface by using hydrogen gas before supplying nitrogen gas.

Although FIG. 7 shows an example in which the stop of the supply of nitrogen gas and the supply of hydrogen gas or the start of the supply of hydrogen gas and the supply of nitrogen gas are sequentially performed, the stop of the supply of nitrogen gas and the supply of hydrogen gas or the start of the supply of hydrogen gas and the supply of nitrogen gas may be performed simultaneously. Further, the first plasma power supply 182 may be provided in each of the first-1 gas supply unit and the first-2 gas supply unit, and the start or stop of the supply of nitrogen radicals and the start or stop of the supply of hydrogen radicals may be independently controlled.

In addition, the method for forming a gallium nitride film according to the present modification can also be applied to other modifications.

Third Embodiment

A substrate support 110A of the gallium nitride film formation apparatus 10 according to an embodiment of the present invention is described with reference to FIGS. 8 and 9. In addition, the description of the same configuration as that described in the First and Second embodiments may be omitted in the following description.

Figure 8:
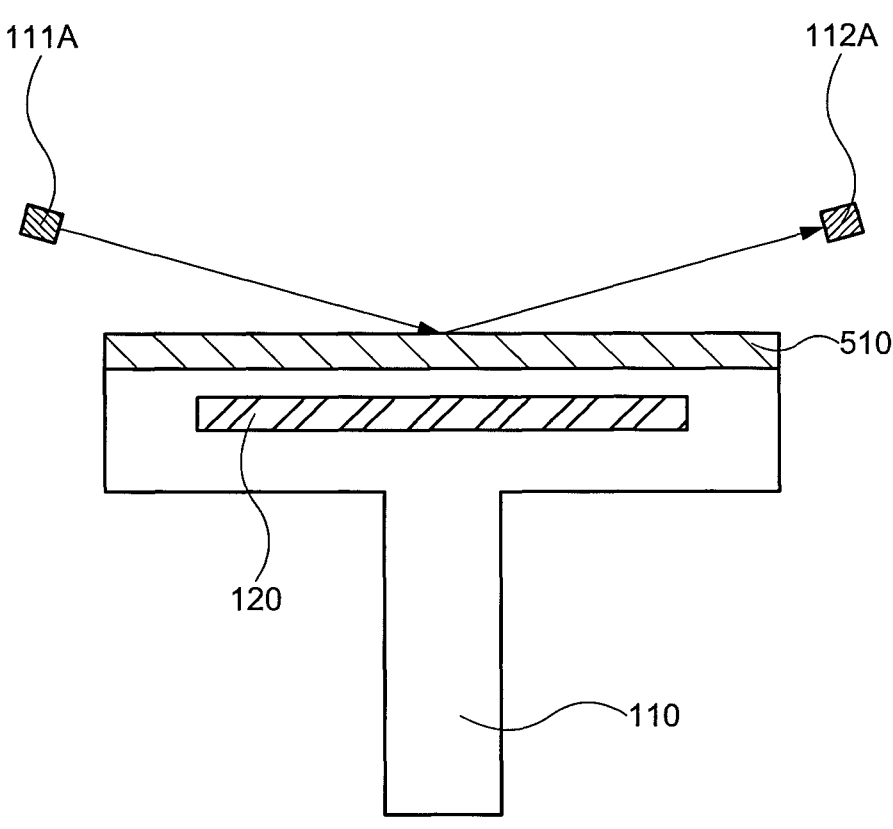
FIG. 8 is a schematic diagram showing a substrate support portion of a film formation apparatus according to an embodiment of the present invention.

FIG. 8 is a schematic diagram showing the substrate support 110A of the film formation apparatus 10 according to an embodiment of the present invention.

As shown in FIG. 8, the film formation apparatus 10 is provided with a light irradiation unit 111A that irradiates light onto a substrate 510 placed on a substrate support portion 110A, and a light receiving unit 112A that receives light reflected from the substrate 510. The installation positions of the light irradiation unit 111A and the light receiving unit 112A in the film formation apparatus 10 are not limited to a specific position. The light irradiated by the light irradiation unit 111A is infrared light or visible light.

Figure 9:
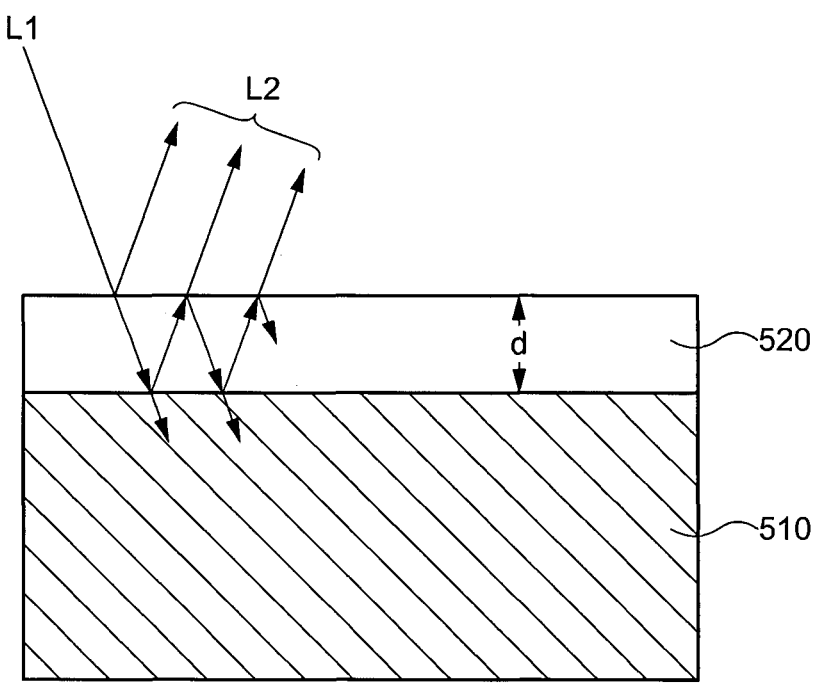
FIG. 9 is a schematic diagram illustrating a measurement of a thickness of a gallium nitride film in a film formation apparatus according to an embodiment of the present invention.

FIG. 9 is a schematic diagram illustrating a measurement of a thickness of a gallium nitride film in the film formation apparatus 10 according to an embodiment of the present invention.

As described in the Second Embodiment, there is an off-period of the sputtering power supply 160 in the formation of a gallium nitride film using the film formation apparatus 10. In the off-period, no plasma is generated in the vacuum chamber 100. Therefore, when the light L1 is irradiated from the light irradiation unit 111A, the light receiving unit 112A can receive the light reflected from the substrate 510 and the gallium nitride film 520 formed on the substrate.

The substrate 510, the gallium nitride film 520, and the atmosphere in the vacuum chamber 100 have different refractive indices. Therefore, the light L1 irradiated from the light irradiation unit 111A not only passes through the substrate 510 and the gallium nitride film 520, but is also reflected at the interface between the substrate 510 or the buffer layer formed on the substrate 510 and the gallium nitride film 520, or at the surface of the gallium nitride film 520. That is, the light receiving unit 112A receives the light L2 that has been reflected multiple times. As the flat gallium nitride film 520 grows, the reflected light from the substrate 510 and the gallium nitride film 520 interferes with each other, so that periodic vibrations occur. That is, vibrations in reflectance of the light received by the light receiving unit 112A occurs, and is detected as a periodic pattern. Specifically, when the wavelength of the light L1 is $\lambda$, the optical path difference 2nd of the light L2 is expressed by the formula 2nd=k$\lambda$ (k is a natural number). Here, n is the refractive index of the gallium nitride film 520, and d is the thickness of the gallium nitride film 520. Therefore, the thickness d of the gallium nitride film 520 can be calculated based on the periodic pattern and the above formula.

In the film formation apparatus 10 according to an embodiment of the present invention, the film thickness of the gallium nitride film can be measured using the interference phenomenon when light is irradiated while the sputtering power supply 160 is in the off-state. Therefore, in the film formation apparatus 10, the film thickness of the gallium nitride film to be formed can be controlled.

Fourth Embodiment

Figure 10:
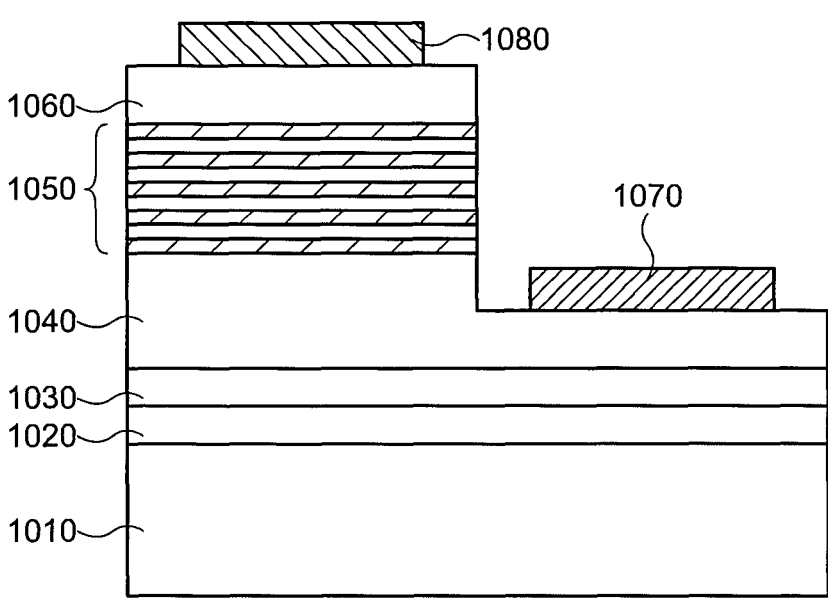
FIG. 10 is a schematic diagram showing a configuration of a light emitting element according to an embodiment of the present invention.

FIG. 10 is a schematic diagram showing a configuration of a light emitting element 1000 according to an embodiment of the present invention.

As shown in FIG. 10, the light emitting element 1000 includes a substrate 1010, a barrier layer 1020, a buffer layer 1030, an n-type semiconductor layer 1040, a light emitting layer 1050, a p-type semiconductor layer 1060, an n-type electrode 1070, and a p-type electrode 1080. Although the light emitting element 1000 is a so-called LED (Light Emitting Diode), the light emitting element 1000 is not limited thereto.

For example, a glass substrate, a quartz substrate, or the like can be used as the substrate 1010. For example, a silicon nitride film or the like can be used as the barrier layer 1020. For example, an aluminum nitride film or the like can be used as the buffer layer 1030. For example, a gallium nitride film doped with silicon or the like can be used as the n-type semiconductor layer 1040. For example, a stacked structure in which an indium gallium nitride film and a gallium nitride film are alternately stacked can be used for the light emitting layer 1050. For example, a gallium nitride film doped with magnesium or the like can be used as the p-type semiconductor layer 1060. For example, a metal such as indium can be used as the n-type electrode 1070. For example, a metal such as palladium or gold can be used as the p-type electrode 1080. In the light emitting device 1000 according to the present embodiment, a configuration in which the barrier layer 1020 is not provided may also be applied.

A manufacturing method of the light emitting device 1000 is described as follows. A silicon nitride film and an aluminum nitride film are sequentially formed on the substrate 1010 to form the barrier layer 1020 and the buffer layer 1030. Further, a gallium nitride film doped with silicon is formed on the buffer layer 1030. Furthermore, an indium gallium nitride film and a gallium nitride film are alternately formed on the buffer layer 1030 to form a stacked structure. Moreover, a gallium nitride film doped with magnesium is formed on the stacked structure. Next, the gallium film doped with magnesium, the stacked structure, and the gallium nitride film doped with silicon are etched using photolithography to form the p-type semiconductor layer 1060, the light emitting layer 1050, and the n-type semiconductor layer 1040. At this time, etching is performed so as to expose a part of the surface of the gallium nitride film doped with silicon. The n-type electrode 1070 and the p-type electrode 1080 are formed on the n-type semiconductor layer 1040 and the p-type semiconductor layer 1060, respectively.

In the present embodiment, the film formation apparatus 10 can be used to form not only the gallium nitride film of the light emitting layer 1050 but also the aluminum nitride film of the light emitting layer 1050. When the aluminum gallium nitride film is formed, aluminum gallium nitride containing nitrogen, aluminum, and gallium can be used for the target 130 of the film formation apparatus 10. Further, two vacuum chambers may be connected through a substrate transport unit, a gallium nitride film may be formed in one vacuum chamber, and an aluminum gallium nitride film may be formed in the other vacuum chamber without breaking the vacuum.

In addition, the film formation apparatus 10 can also be used to form the aluminum nitride film for the buffer layer 1030, the gallium nitride film doped with silicon for the n-type semiconductor layer 1040, or the gallium nitride film doped with magnesium for the p-type semiconductor layer 1060.

As described above, since the gallium nitride film of the light emitting device 1000 according to the present embodiment is formed using the film formation apparatus 10, the light emitting device 1000 can be manufactured using a substrate with low heat resistance, such as a glass substrate.

Fifth Embodiment

Figure 11:
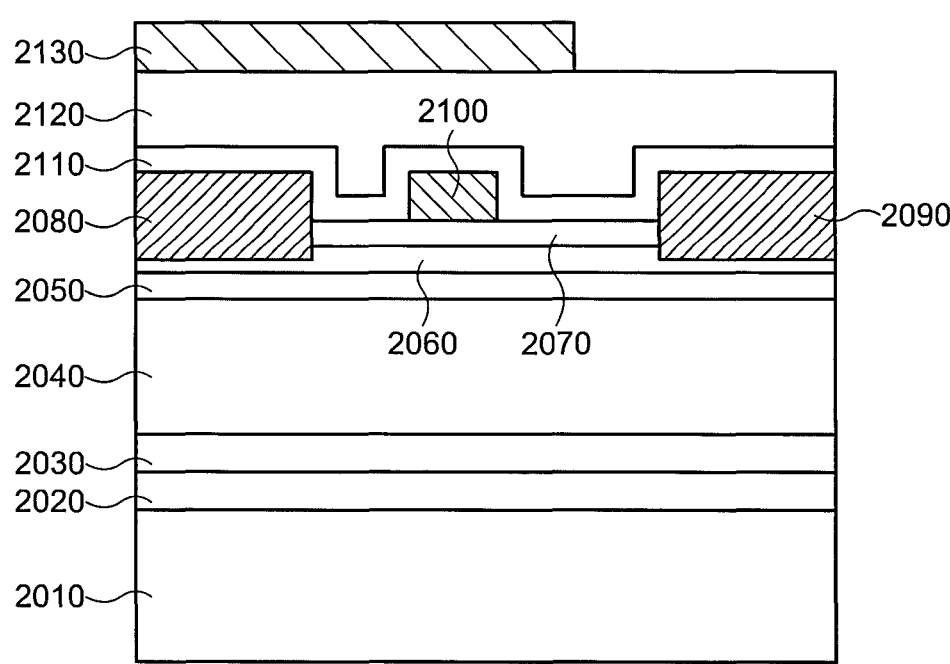
FIG. 11 is a schematic diagram showing a configuration of a semiconductor element according to an embodiment of the present invention.

FIG. 11 is a schematic diagram showing a configuration of a semiconductor device 2000 according to an embodiment of the present invention.

As shown in FIG. 11, the semiconductor device 2000 includes a substrate 2010, a barrier layer 2020, a buffer layer 2030, a gallium nitride layer 2040, a first aluminum gallium nitride layer 2050, a second aluminum gallium nitride layer 2060, a third aluminum gallium nitride layer 2070, a source electrode 2080, a drain electrode 2090, a gate electrode 2100, a first insulating layer 2110, a second insulating layer 2120, and a shield electrode 2130. Although the semiconductor device 2000 is a so-called HEMT (High Electron Mobility Transistor), the semiconductor device 2000 is not limited thereto.

For example, a glass substrate, a quartz substrate, or the like can be used as the substrate 2010. For example, a silicon nitride film or the like can be used as the barrier layer 2020. For example, an aluminum nitride film or the like can be used as the buffer layer 2030. For example, a gallium nitride film can be used as the gallium nitride layer 2040. For example, an aluminum gallium nitride film can be used as the first aluminum gallium nitride layer 2050. For example, a gallium nitride film doped with silicon can be used as the second aluminum gallium nitride layer 2060. For example, an aluminum gallium nitride film can be used as the third aluminum gallium nitride layer 2070. For example, a metal such as titanium or aluminum can used for the source electrode 2080 and the drain electrode 2090. For example, a metal such as nickel or gold can be used for the gate electrode 2100. For example, a silicon nitride film or the like can be used as the first insulating layer 2110. For example, a silicon oxide film or the like can be used as the second insulating layer 2120. A stacked metal such as aluminum/ titanium (Al/Ti) can be used for the shield electrode 2130. In addition, in the semiconductor element 2000 according to the present embodiment, a configuration in which the barrier layer 1020 is not provided can also be applied.

A manufacturing method of the semiconductor element 2000 is as described as follows. A silicon nitride film, an aluminum nitride film, a gallium nitride film, and an aluminum gallium nitride film are formed on the substrate 2010 to form the barrier layer 2020, the buffer layer 2030, the gallium nitride layer 2040, and the first aluminum gallium nitride layer 2050. Further, an aluminum gallium nitride film doped with silicon and an aluminum gallium nitride film are formed on the first aluminum gallium nitride layer 2050. Next, the aluminum gallium nitride film and the aluminum gallium nitride film doped with silicon are etched using photolithography to form the third aluminum gallium nitride layer 2070 and the second aluminum gallium nitride layer 2060. At this time, etching is performed so as to expose a part of the surface of the aluminum gallium nitride film doped with silicon. The source electrode 2080 and the drain electrode 2090 are formed on the second aluminum gallium nitride layer 2060. Further, the gate electrode 2100 is formed on the third aluminum gallium nitride layer 2070. A silicon nitride film and a silicon oxide film are formed in this order to cover the source electrode 2080, the drain electrode 2090, and the gate electrode 2100 to form the first insulating layer 2110 and the second insulating layer 2120. The shield electrode 2130 is formed on the second insulating layer 2120.

In the present embodiment, the film formation apparatus 10 can be used to form not only the gallium nitride film of the gallium nitride layer 2040 but also the aluminum nitride film of the buffer layer 2030, the aluminum nitride film of the first aluminum gallium nitride layer 2050, the aluminum gallium nitride film doped with silicon of the second aluminum gallium nitride layer 2060, and the aluminum gallium nitride film of the third aluminum gallium nitride layer 2070.

As described above, since the gallium nitride film of the semiconductor device 2000 according to the present embodiment is formed using the film formation apparatus 10, the semiconductor device 2000 can be manufactured using a substrate with low heat resistance, such as a glass substrate.

Each of the embodiments described above as the embodiments of the present invention can be appropriately combined and implemented as long as no contradiction is caused. Further, the addition, deletion, or design change of components, or the addition, deletion, or condition change of processes as appropriate by those skilled in the art based on each of embodiments are also included in the scope of the present invention as long as they are provided with the gist of the present invention.

Further, it is understood that, even if the effect is different from those provided by each of the above-described embodiments, the effect obvious from the description in the specification or easily predicted by persons ordinarily skilled in the art is apparently derived from the present invention.

What is claimed is:

1. A film formation method of a gallium nitride film, comprising:
   placing a substrate so as to face a target containing nitride and gallium in a vacuum chamber;
   heating the substrate;
   supplying a sputtering gas to the vacuum chamber;

supplying a nitrogen radical and a hydrogen radical to the vacuum chamber;
   applying a voltage to the target to generate a plasma of the sputtering gas;
   stopping the application of the voltage to the target;
   stopping the supply of the nitrogen radical and the hydrogen radical to the vacuum chamber; and
   supplying a chlorine radical to the vacuum chamber,
   wherein gallium nitride generated by a recombination reaction between the gallium sputtered from the target and the nitrogen radical, and gallium nitride generated by a recombination reaction between a gallium cation generated from the gallium of the target and a nitrogen anion generated from the nitrogen radical are deposited on the substrate, and
   wherein the gallium nitride film formed on the substrate is etched using the chlorine radical.

2. The film formation method of a gallium nitride film according to claim 1, wherein the nitrogen radical and the hydrogen radical are generated from one of an $N_2/H_2$ mixed gas and an $NH_3$ gas.

3. The film formation method of a gallium nitride film according to claim 1, further comprising:
   supplying a nitrogen gas and a hydrogen gas to the vacuum chamber after stopping the supply of the nitrogen radical and the hydrogen radical; and
   stopping the supply of the nitrogen gas to the vacuum chamber, then stopping the supply of the hydrogen gas to the vacuum chamber.

4. The film formation method of a gallium nitride film according to claim 1, wherein the chlorine radical is generated from one of $Cl_2$ and $BCl_3$.

5. The film formation method of a gallium nitride film according to claim 1, further comprising applying a voltage to the target to generate a chlorine anion after the chlorine radical is supplied to the vacuum chamber,
   wherein the gallium nitride film formed on the substrate is etched using the chlorine anion.

6. The film formation method of a gallium nitride film according to claim 1, wherein the sputtering gas is at least one of argon and krypton.

7. The film formation method of a gallium nitride film according to claim 1, wherein the substrate is one of a glass substrate and a quartz substrate.

8. The film formation method of a gallium nitride film according to claim 1,
   wherein the substrate is a glass substrate, and
   wherein the glass substrate is heated to a temperature higher than or equal to 400° C. and lower than or equal to 600° C.

* * * * *